United States Patent [19]

Ito et al.

[11] 4,412,907

[45] Nov. 1, 1983

[54] FERROMAGNETIC HIGH SPEED SPUTTERING APPARATUS

[75] Inventors: Akio Ito; Kyuzo Nakamura; Yoshifumi Ota, all of Yachimata; Taiki Yamada, Chiba, all of Japan

[73] Assignee: Nihon Shinku Gijutsu Kabushiki Kaisha, Kanagawa, Japan

[21] Appl. No.: 401,079

[22] Filed: Jul. 23, 1982

[51] Int. Cl.³ .......................................... C23C 15/00
[52] U.S. Cl. ................................ 204/298; 204/192 R
[58] Field of Search ........................................ 204/298

[56] References Cited

U.S. PATENT DOCUMENTS

| | | | |
|---|---|---|---|
| 4,158,589 | 6/1979 | Keller | 204/298 |
| 4,162,954 | 7/1979 | Morrison | 204/298 |
| 4,180,450 | 12/1979 | Morrison | 204/298 |
| 4,198,283 | 4/1980 | Class et al. | 204/298 |
| 4,239,611 | 12/1980 | Morrison | 204/298 |
| 4,265,729 | 5/1981 | Morrison | 204/298 |

FOREIGN PATENT DOCUMENTS 56-44132  3/1981  Japan.
56-44133  3/1981  Japan.

Primary Examiner—Arthur P. Demers
Attorney, Agent, or Firm—Armstrong, Nikaido, Marmelstein & Kubovcik

[57] ABSTRACT

A ferromagnetic, high speed, sputtering apparatus is provided which comprises a vacuum chamber and a target of ferromagnetic material. The target comprises at least two segments which are positioned adjacent to one another and have a gap therebetween. This gap has at least a portion of which that does not extend in the direction of the thickness of the target. A substrate in the vacuum chamber is positioned facing one side of the target. Also, magnetic field generating means is positioned on the other side of the target so that the magnetic field therefrom leaks through the gap.

7 Claims, 8 Drawing Figures

FERROMAGNETIC HIGH SPEED SPUTTERING APPARATUS

BACKGROUND OF THE INVENTION

1. Field of the Invention

This invention relates to a high-speed sputtering apparatus using a target of ferromagnetic substance, such as Fe, Co, Fe—Ni, Co—Cr, Co—R, $Fe_3O_4$, $BaO.Fe_2O_3$ or the like.

2. Description of the Prior Art

Sputtering apparatuses are known which use a target of a ferromagnetic substance as a cathode in which the cathode and a substrate are positioned in the evacuable treatment chamber. The target of ferromagnetic substance comprises at least two separate segments of ferromagnetic substance which are spaced apart, one from another, by a small gap so that a magnetic field from a magnetic field generating means positioned behind the target is leaked out to the surface of the target of ferromagnetic substance. Japanese Patent Application Nos. Sho-56-44132 and Sho 56-44133 illustrate this type of prior art apparatus.

This type of prior art apparatus has the advantage that even if the intensity of the magnetic field generated by the magnetic field generating means is below the magnetic saturation value of the ferromagnetic substance, there is a comparatively large leakage magnetic field on the surface of the target and the target of the ferromagnetic substance can thus be made with a relatively large thickness—with the result that sputtering of the ferromagnetic substance can be carried out for a long time and at a high efficiency. If, in this type of apparatus, the small gap between the adjacent segments of ferromagnetic substance is below about 3 mm, the plasma does not enter the gap under ordinary electric discharge conditions and thus there is no possibility of sputtering of the backing plate provided on the back of the target of ferromagnetic substance.

However, it has been found that there is a possibility of an unfavorable phenomenon in that the backing plate is sputtered and the resultant particles adhere as foreign matter to the substrate, even though the plasma does not enter the small gap of 3 mm or so under certain conditions of varied electric discharge conditions. The cause of this phenomenon is not clear but it appears that ions of a gas such as Ar or the like, charged in the vacuum treatment chamber, are accelerated in speed at a dark space formed between the target and a plasma region ahead of the target and some of them pass through the small gap and sputter the backing plate.

SUMMARY OF THE INVENTION

It is the primary object of the present invention to provide a ferromagnetic sputtering apparatus in which the target backing plate does not have sputtered material deposited thereon.

The present invention is directed to a ferromagnetic high speed sputtering apparatus which comprises a vacuum chamber with a target of ferromagnetic material positioned in the vacuum chamber. The target includes a plurality of segments positioned adjacent to one another with a small gap therebetween. The gap has at least a portion which does not extend in the direction of the thickness of the target. A backing plate is positioned on one side of the target adjacent thereto and a magnetic field generating means is positioned with respect to the target and backing plate such that the magnetic field therefrom leaks through the gap. A substrate is positioned in the vacuum chamber spaced from the other side of the target.

DETAILED DESCRIPTION OF THE PREFERRED EMBODIMENT

Figure 1:
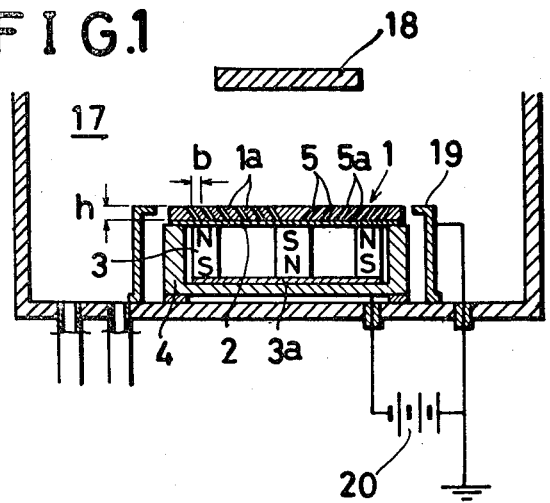
FIG. 1 is a sectional side view of one embodiment of the present invention.
Figure 2:
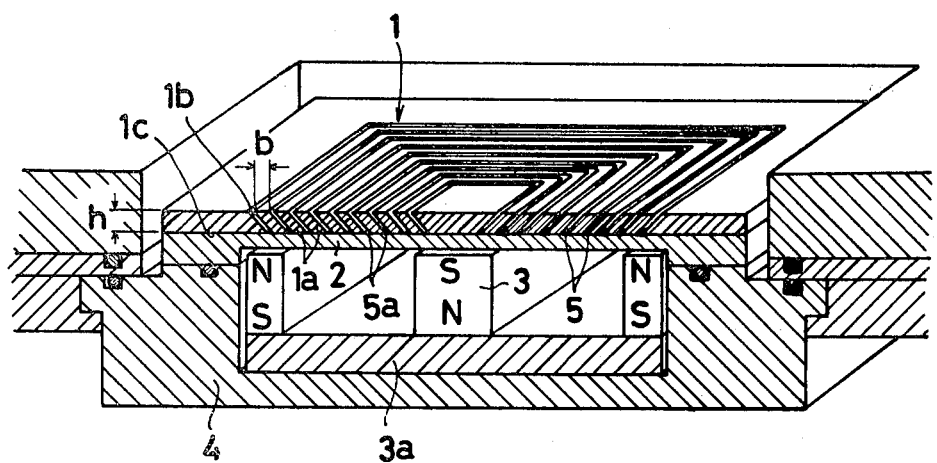
FIG. 2 is an enlarged perspective view of a portion of the embodiment of FIG. 1.

Referring to FIGS. 1 and 2, which show a first embodiment of the present invention, a target 1 is made of such ferromagnetic substance as Fe or the like and is positioned in an evacuable treatment chamber 17 such that it faces a substrate 18. A backing plate 2, made of nonferromagnetic substance, is provided on the back of the target 1 and a magnetic field generating means 3, made of a barium ferrite magnet or the like, is positioned on the rear of the backing plate 2. A water cooling tank 4, made of nonferromagnetic substance, contains water for cooling the backing plate 2. A yoke 3a, an anode 19 and a D.C. current source 20 are also provided.

The target of ferromagnetic substance 1 is formed with plural segments of ferromagnetic substance 1a positioned to leave a small gap 5 between every adjacent segment 1a. Thus, when a cathode potential is applied to the target 1, the target 1 is sputtered and atoms thereof are deposited on the substrate 18.

According to the present invention, the small gap 5 is formed either inclined or bent with respect to the depth or height of the target 1 so that ions entering the small gap may strike against the inner side wall surface of the gap. Thereby, the foregoing phenomenon, that is, the phenomenon in which the backing plate is sputtered, is prevented.

In the embodiment shown in FIGS. 1 and 2, each segment of ferromagnetic substance 1a is formed into an annular portion of 3 mm in width b and 5 mm in height h, and the side surface 1b thereof is inclined at an angle of 25° with respect to a vertical line perpendicular to the horizontal bottom surface 1c, such that the segment 1c is a parallelogram in cross-section. The plural segments are fixed to the backing plate 2 with a small gap of 0.5 mm.

Figure 3:
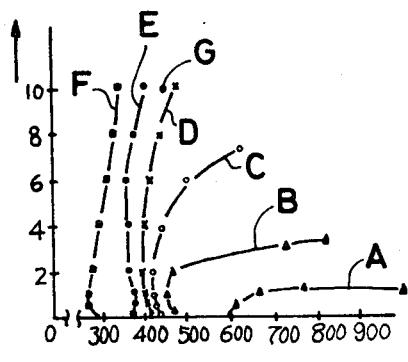
FIG. 3 is a diagram showing electric discharge characteristic curves of the embodiment of FIG. 1.

The target 1 of Fe of this size and form has positioned behind it the magnetic field generating means 3, which is a barium ferrite magnet and it is arranged such that a magnetic field of 730 Gauss is generated at the middle portion between the magnetic poles on the surface of the target 1. While the Ar gas pressure in the evacuable treatment chamber 17 is varied, various voltages of the D.C. source 20 are applied thereto for examining the electric discharge characteristics thereof. As a result thereof, it has been found that there are generated comparatively high discharge currents peculiar to high-speed sputtering as shown in FIG. 3. In FIG. 3, a curve A shows the characteristic for Ar pressure of $3.0 \times 10^{-3}$ Torr, curve B for Ar pressure of $5.0 \times 10^{-3}$, curve C for Ar pressure of $7.0 \times 10^{-3}$, curve D for Ar pressure $1.0 \times 10^{-2}$, curve E for Ar pressure of $2.0 \times 10^{-2}$ and curve F for Ar pressure of $5.0 \times 10^{-2}$.

In this case, the target 1 is 203 mm × 127 mm in size and the distance thereof from the substrate 18 is 50 mm. The deposition speed of Fe on the surface of the substrate 18 is a high speed 12600 A/min under the condition of a point G in FIG. 3; that is, the condition of Ar pressure of $1.0 \times 10^{-2}$ Torr and 450 V. It was noted that the backing plate 2 did not contain any deposit. It can be surmized from this fact that the ions entering the inclined small gap 5 from the front side of the target 1 strike against the inner side wall surface of the small gap 5 and cannot reach the backing plate 2 located further to the rear thereof.

Figure 4:
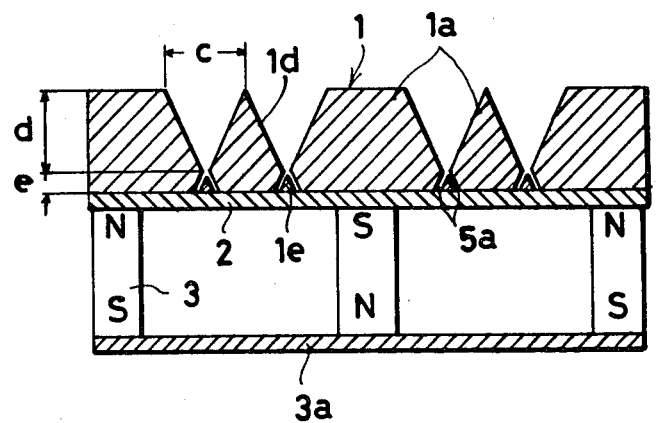
FIG. 4 is a sectional side view of another embodiment of the present invention.

In another embodiment of the present invention, each segment of ferromagnetic substance 1a comprising the target of ferromagnetic substance 1 may be provided with sloped portions having slanted surfaces as shown in FIG. 4 for extending the service life of the target 1. In this case, the inclined small gap 5a formed between every adjacent segment may comprise two bifurcated segments diverged one from another so that there is formed therebetween a small triangular segment of ferromagnetic substance 1e. In this embodiment, the target of ferromagnetic substance 1 shown in FIG. 4 is made of Fe and is so constructed that a distance c between the sloped portions thereof is 20 mm, the height d of the sloped portion is 20 mm, the height e of the base portion of the target 1 is 5 mm, the width of each of the diverged small gaps 5a is 2 mm and the inclination angle thereof is about 25°.

Figure 5:
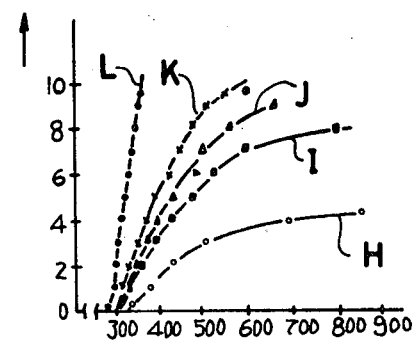
FIG. 5 is a diagram showing electric discharge characteristic curves of the embodiment of FIG. 4.

If a D.C. voltage, while varied in value, is applied thereto, the electric discharge characteristics thereof are shown in FIG. 5. In FIG. 5, curve H shows the electric discharge characteristics when the Ar gas pressure in the evacuable treatment chamber 17 is $5.0 \times 10^{-4}$ Torr, curve I is when the gas pressure is $1.0 \times 10^{-3}$, a curve J is when the gas pressure is $3.0 \times 10^{-3}$, curve K is when the gas pressure is $1.0 \times 10^{-2}$ and curve L is when the gas pressure is $2.0 \times 10^{-2}$.

In this case, the distance between the target 1 and the substrate 18 is 30 mm. When the Ar gas pressure is about $1.0 \times 10^{-2}$ Torr and the D.C. voltage is about 600 V, Fe is deposited on the surface of the substrate 18 at a speed of 6300 A/min., and it has been noted that the backing plate 2 did not contain any deposit.

Figure 6:
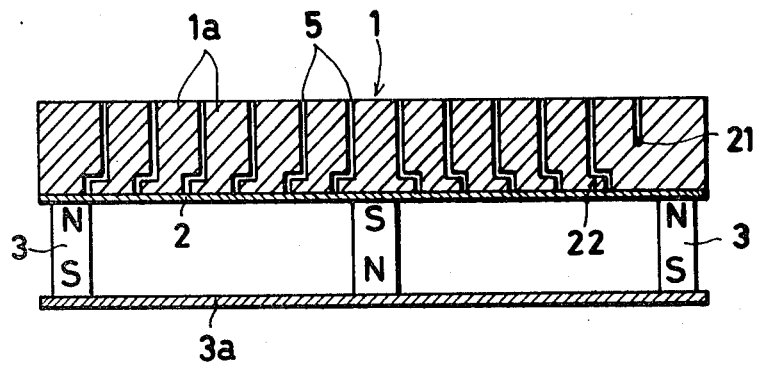
FIGS. 6–8 are sectional side views of further embodiments of the present invention.
Figure 7:
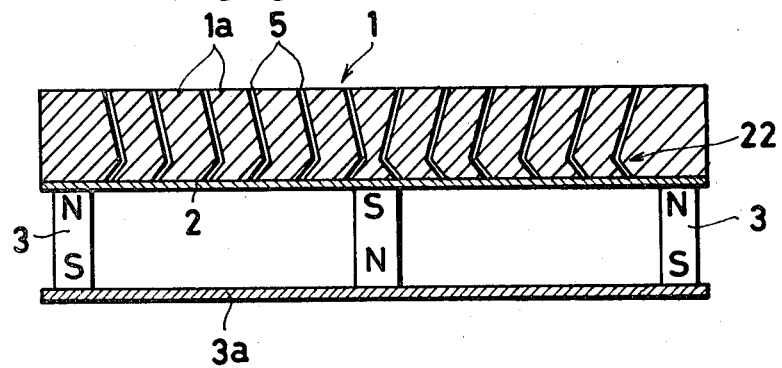
Figure 8:
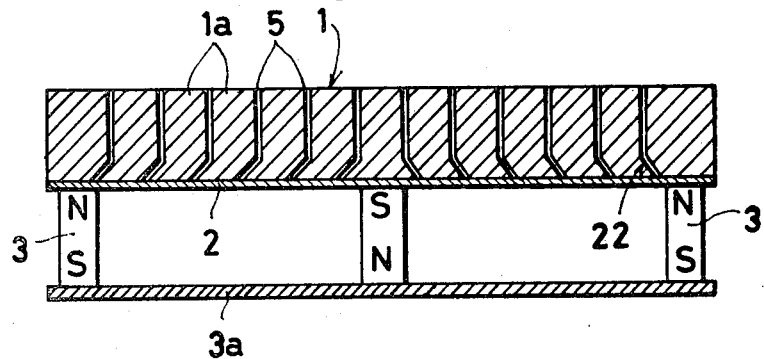

FIGS. 6-8 show further embodiments of the present invention wherein each small gap 5 is bent. In these embodiments, each bent small gap 5 can be formed, for example, by a wire type cutting tool 21 brought into pressure contact with the surface of the target 1 and under pressure reciprocated horizontally. The cutting tool is gradually advanced inwards and is at a certain cutting depth moved to the left or the right and is then moved downwards to cut therethrough. With this arrangement, the ions strike against the bent portion 22 of the small gap 5, thereby they are prevented from advancing further and passing therethrough. Consequently, the backing plate 2 is never sputtered.

Thus according to this invention, plural small gaps in the target of ferromagnetic substance are formed which have at least a portion which is not aligned in the direction of the height or thickness of the target so that the sputtering of the backing plate by ions passing through the small gaps is prevented, and a comparatively large magnetic field is still leaked out to the surface of the target. The ferromagnetic substance can thus be deposited at a high speed on the surface of the substrate.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims rather than the foregoing description, and all changes which come within the meaning and range of equivalency of the claims are, therefore, to be embraced therein.

What is claimed:

1. A ferromagnetic, high speed, sputtering apparatus comprising:
    (a) a vacuum chamber;
    (b) a target means of ferromagnetic material, positioned in said vacuum chamber, said target means comprising at least two segments positioned adjacent to one another with a gap therebetween, wherein said gap has at least a portion thereof which does not extend in the direction of the thickness of said target means;
    (c) substrate means in said vacuum chamber positioned facing one side of said target means; and
    (d) magnetic field generating means positioned on the other side of said target means such that the magnetic field therefrom leaks through said gap.

2. An apparatus as set forth in claim 1 including a backing plate positioned between said target means and said magnetic field generating means.

3. An apparatus as set forth in claim 1 wherein said magnetic field generating means is at least one permanent magnet.

4. An apparatus as set forth in any one of claims 1-3 wherein the entire length of said gap is inclined with respect to the direction of thickness of said target means.

5. An apparatus as set forth in any one of claims 1-3 wherein a portion of said gap is inclined with respect to the direction of thickness of said target.

6. An apparatus as set forth in any one of claims 1-3 wherein a portion of said gap is perpendicular to the direction of thickness of said target.

7. An apparatus as set forth in any one of claims 1-3 wherein at least two of said segments have inclined side walls not parallel to each other.

* * * * *